United States Patent [19]

Kanamori et al.

[11] Patent Number: 5,153,734
[45] Date of Patent: Oct. 6, 1992

[54] SOLID STATE IMAGE PICKUP DEVICE MOUNTING STRUCTURE

[75] Inventors: Shino Kanamori; Naoki Takatori, both of Minato, Japan

[73] Assignee: Fuji Photo Film Co., Ltd., Kanagawa, Japan

[21] Appl. No.: 617,741

[22] Filed: Nov. 26, 1990

[30] Foreign Application Priority Data

Nov. 30, 1989 [JP] Japan .................. 1-311914
Nov. 5, 1990 [JP] Japan .................. 2-299582

[51] Int. Cl.⁵ .................. H04N 5/225; G02B 7/00
[52] U.S. Cl. .................. 358/225; 358/229; 354/189; 354/286
[58] Field of Search .................. 357/74, 41, 70, 68; 358/40, 41, 229, 29; 354/189, 286, 225, 152; 350/330

[56] References Cited

U.S. PATENT DOCUMENTS

| | | | |
|---|---|---|---|
| 4,271,420 | 6/1981 | Chikamura et al. | 357/41 |
| 4,611,243 | 9/1986 | Morisawa et al. | 358/225 |
| 4,728,980 | 3/1988 | Nakamura et al. | 354/286 |
| 4,769,711 | 9/1988 | Date | 358/229 |
| 4,924,247 | 5/1990 | Suzuki et al. | 358/225 |
| 4,947,239 | 8/1990 | Kondou et al. | 357/24 |
| 5,032,919 | 7/1991 | Randmae | 358/225 |

FOREIGN PATENT DOCUMENTS 60-62781 4/1985 Japan .

Primary Examiner—Andrew J. James
Assistant Examiner—Viet Q. Nguyen
Attorney, Agent, or Firm—Sughrue, Mion, Zinn, Macpeak & Seas

[57] ABSTRACT

A solid state image pickup mounting structure which is used to mount a low pass filter onto the upper surface of a solid state image pickup element and fix them to a reference plate. The mounting structure includes a low pass filter holder formed of an elastic material and having first and second frame portions, and fastening means for fastening and fixing the low pass filter holder through the solid state image pickup element onto the reference plate. According to the mounting structure, the low pass filter is press fitted into the first frame portion of the low pass filter holder and the solid state image pickup element is mounted to the second frame portion in a manner similar to press fitting to thereby form them into a unit with the low pass filter on board the front surface of the solid state image pickup element, and the integrally formed members are then fastened and fixed onto the reference plate by the fastening means.

4 Claims, 8 Drawing Sheets 5,153,734

SOLID STATE IMAGE PICKUP DEVICE MOUNTING STRUCTURE

BACKGROUND OF THE INVENTION

1. Field of the Invention

The present invention relates to a solid state image pickup device mounting structure and, in particular, to a solid state image pickup device mounting structure for mounting a solid state image pickup element, for example, a charge coupled device (CCD) and a low pass filter, disposed just in front of the CCD, to a CCD reference plate.

2. Description of the Related Art

As a conventional solid state image pickup device mounting structure, there has been known such structure as shown in FIG. 13. In FIG. 13, a CCD 2 is firstly positioned in a CCD holder 1. Then, after a Mylar plate 3, an O-ring formed of rubber 4, and a low pass filter 5 are inserted in the CCD holder from above sequentially in this order, a low pass filter frame 6 and the CCD holder 1 are fixed by means of screws 7. Further, a plate spring 8 is fixed to the low pass filter frame 6 by screws 9 to thereby spring energize the upper surface of the low pass filter 5. In this structure, the O-ring 4 is interposed between the upper surface of the Mylar plate 3, the peripheries of the low pass filter 5 and the low pass filter frame 6 to prevent dust from penetrating into the front surface of the CCD.

The CCD 2 and low pass filter 5 are integrated with each other in the above-mentioned manner to provide a dust-proof CCD unit. And, the thus constructed dust-proof CCD unit is positioned and fixed to a lens barrel.

However, the above-mentioned CCD unit requires a large number of parts and much time for assembling, which results in high costs.

SUMMARY OF THE INVENTION

The present invention aims at eliminating the drawbacks found in the above-mentioned conventional structure.

Accordingly, it is an object of the invention to provide a solid state image pickup device mounting structure which requires a reduced number of parts and requires no dust proof parts to thereby reduce costs, and also which is easy to assemble and can be made compact and light weight.

In order to achieve the above object, according to the invention, there is provided a low pass filter holder formed of an elastic material and having first and second frame portions respectively corresponding to the outer peripheries of a low pass filter and a solid state image pickup element, the low pass filter is press fitted into and fixed to the first frame portion of the low pass filter holder, the solid state image pickup element is mounted to the second frame portion of the low pass filter holder in a press fitting manner so as to fix the solid state image pickup element and low pass filter integrally to each other with the low pass filter being on board the front surface of the solid state image pickup element, and the low pass filter holder is fastened and fixed through the solid state image pickup element to a reference plate by fastening means.

Also, according to another aspect of the invention, a low pass filter is press fitted into and fixed to a low pass filter frame formed of an elastic material, a low pass filter holder engageable with the low pass filter frame and a solid state image pickup element is used to hold therein and fix together the low pass filter frame and solid state image pickup element with the low pass filter on board the front surface of the solid state image pickup element, and the low pass filter holder is fastened and fixed through the solid state image pickup element to a reference plate by fastening means.

According to the invention. a low pass filter and a solid state image pickup element are press fitted into a low pass filter holder, which is composed of a single member, and are fixed integrally with each other in a dust proof condition, and after then they are fastened and fixed to a reference plate by means of fastening means such as a screw or the like. Due to this, the number of parts necessary can be reduced to a great extent, and the present structure is easy to handle and assemble.

Alternatively, in place of the above-mentioned low pass filter consisting of a single member, a low pass filter frame member, to which a low pass filter is press fitted and fixed, and a low pass filter holding member for provisionally holding the low pass filter frame member and a solid state image pickup element integrally with each other may also be used with similar effects to the above-mentioned case.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DETAILED DESCRIPTION OF THE INVENTION

Figure 1:
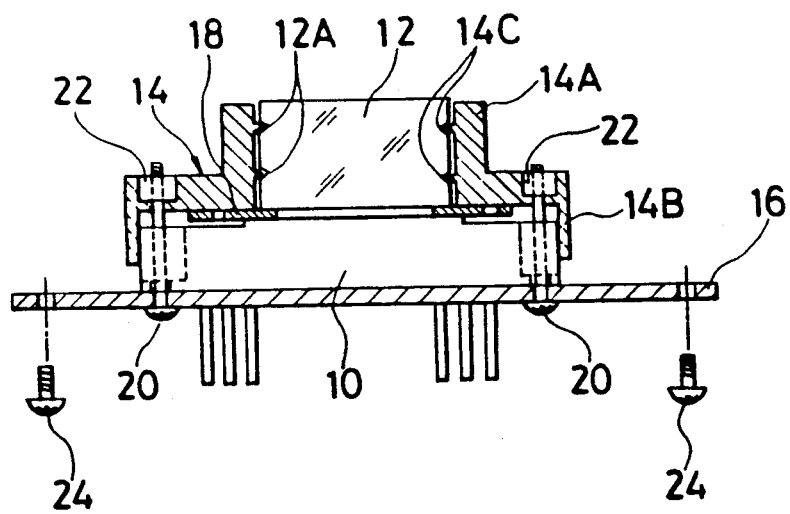
FIG. 1 is a section view of an embodiment of a solid state image pickup device mounting structure according to the invention.

Detailed description will hereunder be given of the preferred embodiment of a solid state image pickup device mounting structure according to the present invention with reference to the accompanying drawings Referring first to FIG. 1, there is shown a section view of an embodiment of a solid state image pickup device mounting structure according to the invention. In FIG. 1, reference numeral 10 designates a solid state image pickup element (CCD), 12 stands for a low pass filter, 14 represents a low pass filter holder, and 16 expresses a CCD reference plate.

The low pass filter 12 is composed of three crystals, respectively having a predetermined thickness and bonded to one another, in order to cut off space functions $f_c$ and $2f_c$; for example, on the outer peripheral surfaces of the crystals bonded, there are formed V-shaped grooves 12A which are used to prevent the low pass filter 12 from slipping off out of place and to position the same.

The low pass filter holder 14 is formed of an elastic member such as silicon rubber or the like and includes first and second frame portions 14A and 14B respectively corresponding to the respective outer peripheries of the low pass filter 12 and CCD 10. Also, the frame portion 14A has an inner peripheral surface on which there is provided V-shaped projections 14C to be engageable with the V-shaped grooves 12A in the low pass filter 12.

When the above-mentioned CCD 10 and low pass filter 12 are to be mounted to the CCD reference plate 16, the low pass filter 12 is first press fitted into the frame portion 14A of the low pass filter holder 14. In this case, the low pass filter 12 must be press fitted until the V-shaped grooves 12A is brought into engagement with the V-shaped projections 14C of the frame portion 14A. This can prevent the low pass filter 12 from slipping off out of place as well as position the low pass filter 12 at a predetermined position of the low pass filter holder 14.

Next, a Mylar plate 18 is interposed between the low pass filter 12 and CCD 10 so as to prevent contact between them, and after that the CCD 10 is mounted to the other frame portion 14B of the low pass filter holder 14 in a press fitting manner. Here, it should be noted that the Mylar plate 18 is positioned in the low pass filter holder 14. Also, at the stage where the low pass filter 12 is mounted to the CCD 10 by means of the low pass filter holder 14, the front surface of the CCD 10 is closed so tightly as to be able to provide a dust-proof effect.

Then, with the CCD 10 and low pass filter 12 formed into a unit in the above-mentioned manner, the low pass filter holder 14 is screwed through the CCD 10 to a CCD reference plate 16 by means of set screws 20 and nuts 22, the nuts 22 respectively being loaded into the low pass filter holder 14 in a press fitting manner. Alternatively, prior to such screwing operation, the CCD 10 may be shifted for X-Y adjustment. In this case, the X-Y adjustment is not necessary when the CCD reference plate 16 is screwed to a lens barrel (not shown).

Figure 2:
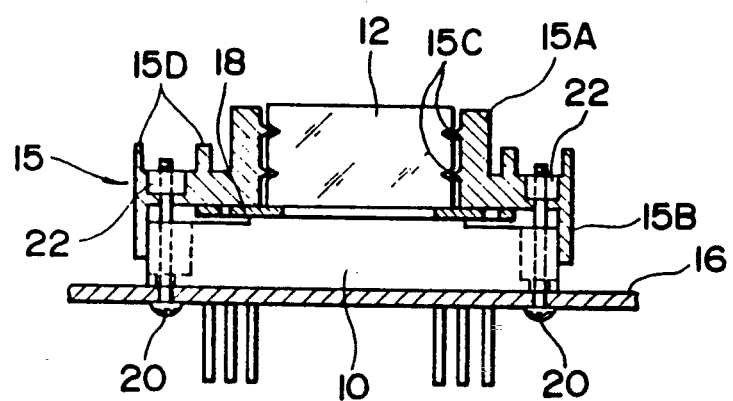
FIGS. 2 and 3 are respectively section views of modifications of a low pass filter shown in FIG. 1.
Figure 3:
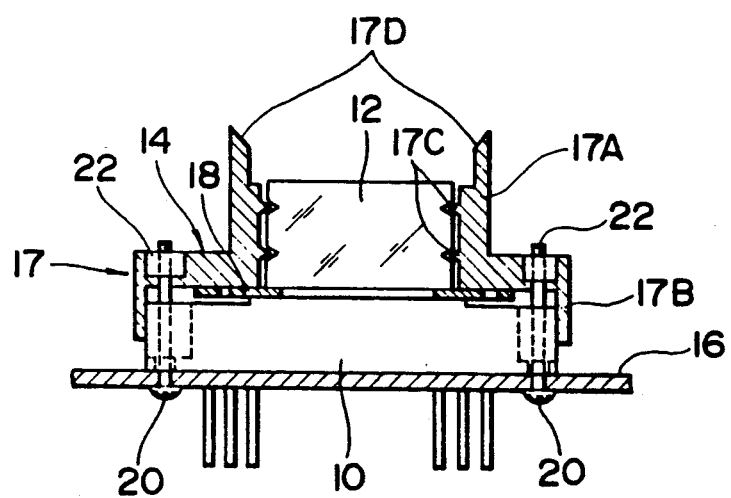

Now, in FIGS. 2 and 3, there are shown section views of a solid state image pickup device mounting structure according to the invention, respectively illustrating modifications of the low pass filter holder 14 shown in FIG. 1. In these figures, parts used in common with FIG. 1 are shown with the same designations and the description thereof is omitted here.

In other words, low pass filter holders 15 and 17 respectively shown in FIGS. 2 and 3 are different from the low pass filter holder 14 shown in FIG. 1 in that they have flanges 15D and 17D formed integrally therewith, respectively.

These flanges 15D and 17D are pressed against the lens barrel, when a camera, is assembled, so as to be able to prevent entrance of light and dust between the lens barrel and low pass filter 12. In these figures, reference characters 15A, 15B, 17A, and 17B designate the frame portions of the low pass filter holders 15 and 17, respectively, and 15C and 17C designate V-shaped projections provided in the low pass filter holders 15 and 17, respectively.

Figure 4:
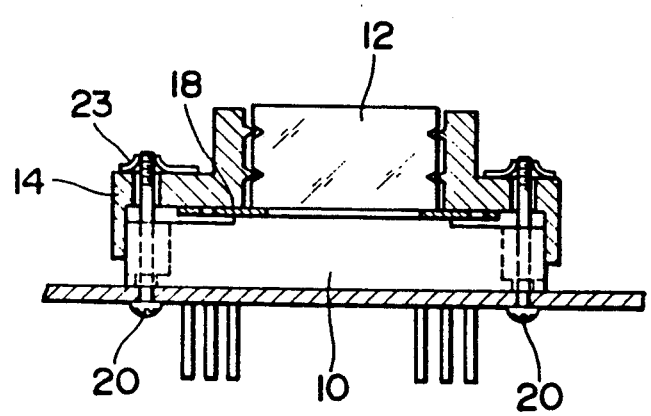
FIGS. 4 and 5 respectively section views of modifications of fastening means shown in FIG. 1.
Figure 5:
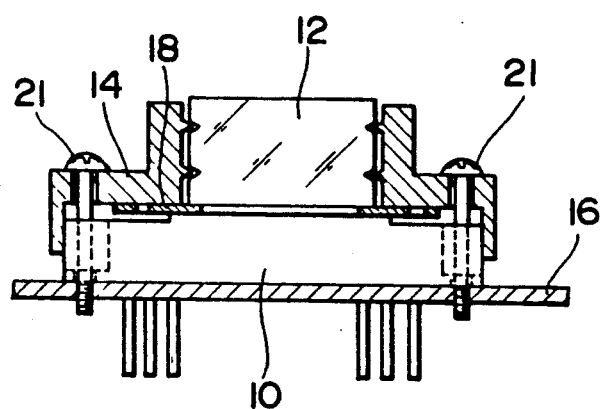

Referring now to FIGS. 4 and 5, there are shown section views of a solid state image pickup device mounting structure according to the invention, respectively illustrating modifications of fastening means shown in FIG. 1 and comprising screws 20 and nuts 22. In these figures, parts used in common with FIG. 1 are given the same designations and the description thereof is omitted here.

In the fastening means shown in FIG. 4, in place of the nut 22, there is used a metal plate 23 having a tapped hole therein. Also, in the fastening means shown in FIG. 5, set screws 21 are screwed directly into the CCD reference plate 16 to thereby fasten the low pass filter holder 14 to the CCD reference plate 16.

Figure 6:
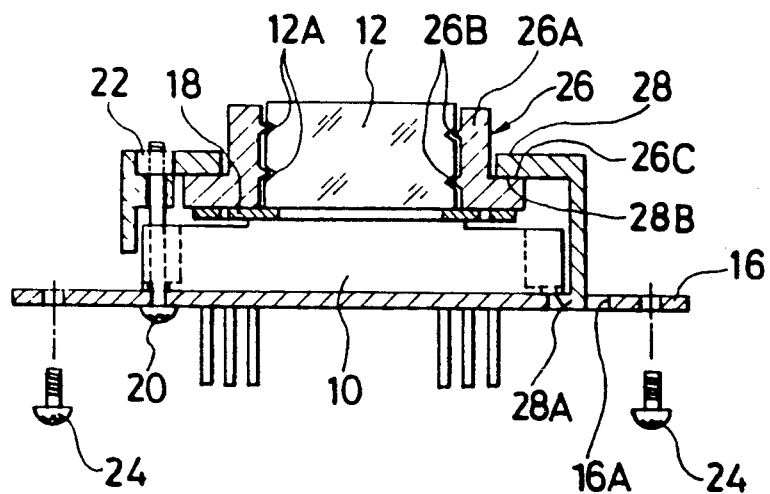
FIG. 6 is a section view of another embodiment of a solid state image pickup device mounting structure according to the invention.

Now, in FIG. 6, there is shown a section view of another embodiment of a solid state image pickup device mounting structure according to the invention. In this figure, parts used in common with FIG. 1 are given the same designations and the description thereof is omitted here.

The mounting structure shown in FIG. 6 is different from the mounting structure shown in FIG. 1 in that, in place of the low pass filter holder 14, there are used a low pass filter frame member 26 and a low pass filter holding member 28.

In other words, the low pass filter frame member 26 is formed of an elastic material such as silicon rubber or the like and has a portion 26A which corresponds to the outer periphery of the low pass filter 12. Also, on the inner peripheral surface of the frame portion 26A there is provided a V-shaped projection 26B which is engageable with the V-shaped groove 12A in the low pass filter 12.

The low pass filter holder member 28 is formed of synthetic resin or the like and is used to hold therein the above-mentioned low pass filter frame member 26 and CCD 10. The low pass filter holder member 28 has a hook 28A engageable with the lower surface of the CCD 10 and a contact surface 28B for contact with a flange portion 26C provided in the low pass filter frame member 26.

Therefore, when mounting the CCD 10 and low pass filter 12 to the CCD reference plate 16, the low pass filter 12 is first press fitted into the portion 26A of the low pass filter frame member 26.

After that, the low pass filter frame member 26, Mylar plate 18 and CCD 10 are inserted sequentially into the low pass filter holder member 28, so that the hook 28A of the low pass filter holder member 28 is brought into engagement with the lower surface of the CCD 10. As a result of this, the low pass filter frame member 26 and CCD 10 can be fixed together.

Then, in such fixed condition, after the X-Y adjustment is performed by shifting the CCD 10 by means of the CCD reference plate 16, the low pass filter holder member 28 is screwed through the CCD 10 to the CCD reference plate 16 by the set screws 20 and nuts 22. It should be noted here that in the CCD reference plate 16 there is formed a hole 16A for prevention of interference with the hook 28A in the low pass filter holder member 28.

Figure 7:
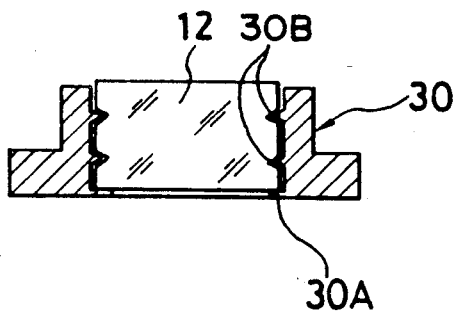
FIGS. 7 to 9 are respectively section views of modifications of a low pass filter frame shown in FIG. 6.
Figure 8:
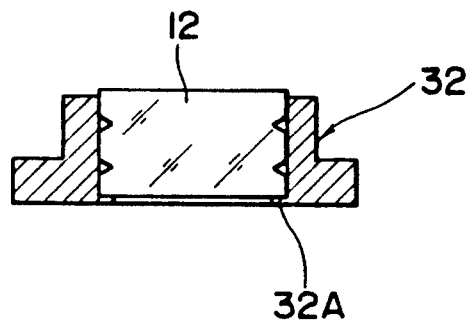

Referring now to FIGS. 7 and 8, there are shown modifications of the low pass filter frame member 26 shown in FIG. 6, respectively, that is, low pass filter frame members 30 and 32. In these low pass filter frame members 30, 32, there are provided projections 30A and 32A which are used to prevent contact between the CCD 10 and low pass filter 12. Due to this, the Mylar plate 18 can be saved as well as the positioning of the low pass filter 12 can be achieved. While there is provided a V-shaped projection 30B on the inner peripheral surface of the low pass filter 30, no such V-shaped projection is provided on the inner peripheral surface of the low pass filter 32.

Figure 9:
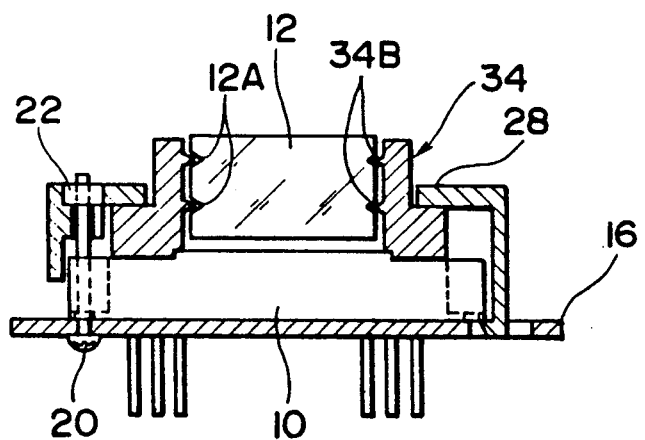

In FIG. 9, there is shown a section view of another modification of the low pass filter frame member 26 shown in FIG. 6. In this figure, parts used in common with FIG. 6 are given the same designations and the description thereof is omitted here.

Although in a low pass filter frame member 34 there is provided no provision for prevention of contact between the CCD 10 and low pass filter 12, the low pass filter frame member 34 is arranged so as to be able to prevent the contact between them. That is, according to this modified embodiment, when the low pass filter frame member 34 is brought into contact with the upper surface of the CCD 10, the low pass filter 12 and CCD 10 being held by the low pass filter frame member 34 can be separated from each other.

Figure 10:
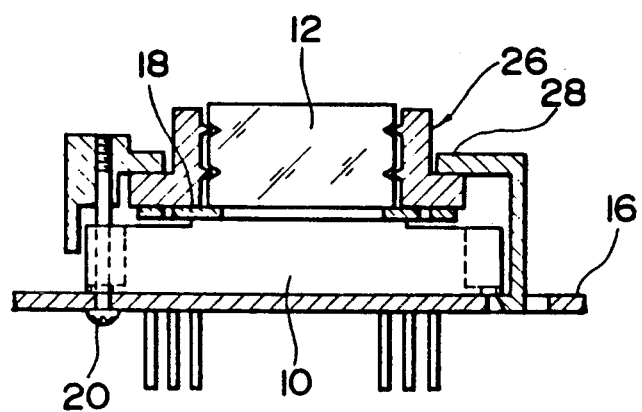
FIGS. 10 and 11 are respectively section views of fastening means shown in FIG. 6.
Figure 11:
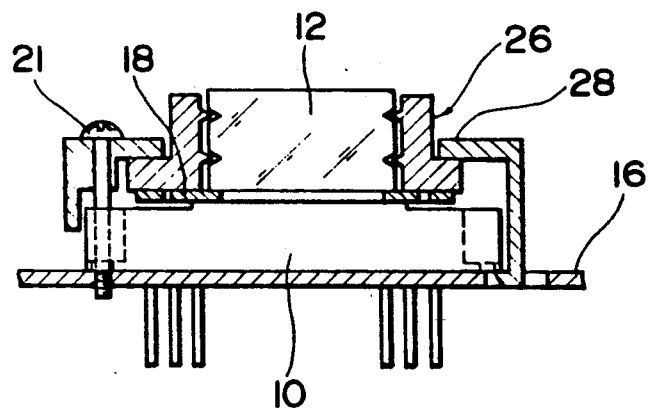

Referring now to FIGS. 10 and 11, there are shown section views of other embodiments of a solid state image pickup device mounting structure according to the invention, respectively illustrating a modification of the fastening means comprising a set screw 20 and a nut 22 shown in FIG. 6. In these figures, parts used in common with FIG. 6 are given the same designations and the description thereof is omitted here.

In particular, according to the fastening means shown in FIG. 10, a nut 22 is not provided but a set screw 20 is screwed directly into the low pass filter holder member 28. On the other hand, according to the fastening means shown in FIG. 11, a set screw 21 is screwed directly into the CCD reference plate 16 to thereby fasten the low pass filter holder member 14 to the CCD reference plate 16.

Figure 12:
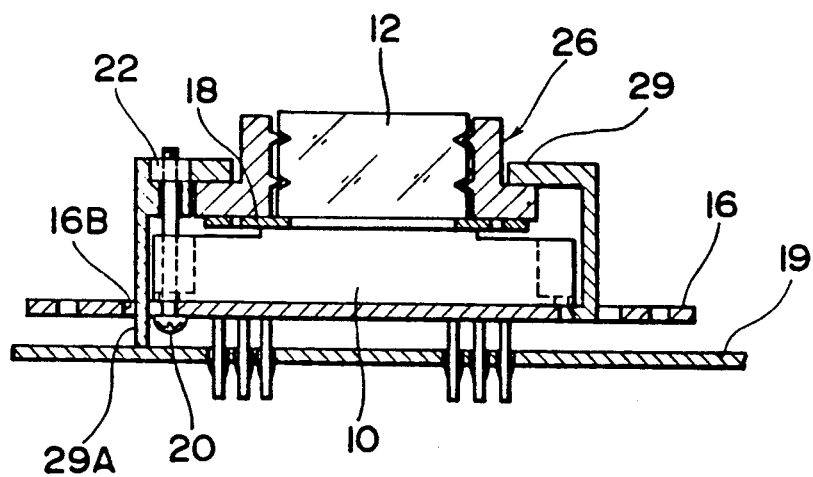
FIG. 12 is a section view of a modification of a low pass filter holder shown in FIG. 6; and, FIG. 13 is a exploded perspective view of a conventional solid state image pickup device mounting structure.
Figure 13:
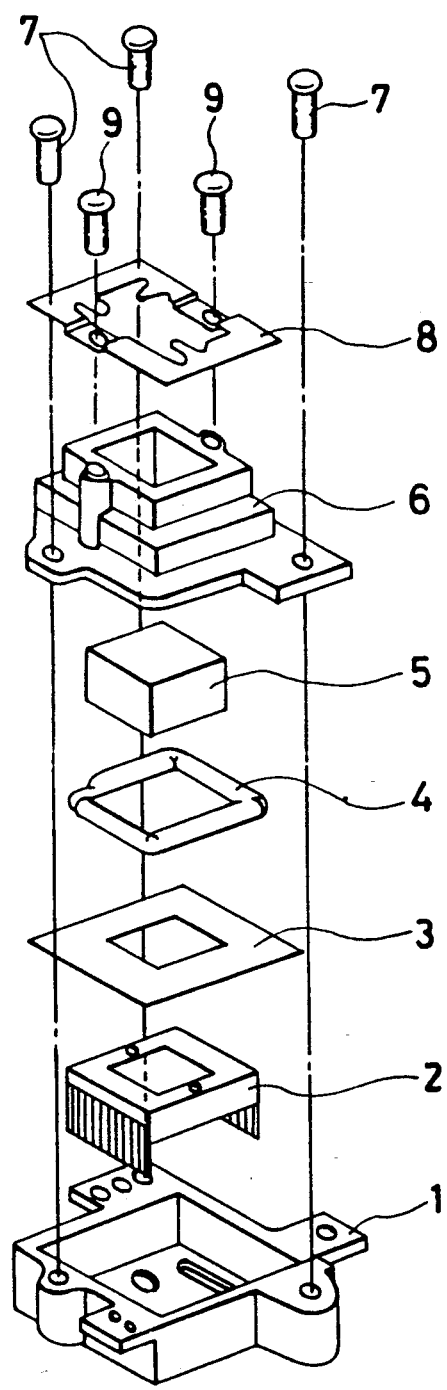

Now, in FIG. 12, there is shown a section view of another embodiment of a solid state image pickup device mounting structure according to the invention, illustrating a modification of the low pass filter holder member 28 shown in FIG. 6. In this figure, parts used in common with FIG. 6 are given the same designations and the description thereof is omitted here.

A low pass filter holder member 29 shown in FIG. 12 includes a leg portion 29A formed integrally with the holder member 29 for receiving a base plate 19. The leg portion 29A extends through a hole 16B formed in the CCD reference plate 16 and touches the base plate 19. This makes it easy to assemble the base plate 19 as well as to solder the end of the CCD 10 to the base plate 19.

Although several embodiments have been described hereinbefore only for the illustration of the present invention, it should be understood that the present invention is not limited to the above-illustrated embodiments, but other modifications are possible without departing from the spirit of the claims accompanied herewith. For example, the flanges 15D and 17D respectively provided in the low pass filter holders 15 and 17 shown in FIGS. 2 and 3 can also be provided in the low pass filter frame members 26, 30 and 32, respectively. Also, in low pass filter holder 14 there can be provided a projection to prevent contact between the CCD 10 and low pass filter 12 so as to save the Mylar plate 18.

As has been described heretofore, according to a solid state image pickup device mounting structure, the number of parts necessary to mount the CCD and low pass filter to the CCD reference plate can be reduced over the conventional mounting structures and members (for example, an O ring) for dust prevention are not required, thereby resulting in the reduced costs. Also, due to the fact that the low pass filter and CCD are united integrally together in a dust-proof condition when they are mounted to the CCD reference plate, the present invention is easy to handle and mount. Further, because the low pass filter holder and low pass filter frame do not exist at all on the front surface of the low pass filter, the present invention can be made more compact (thinner) over the conventional mounting structures.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A solid state image pickup device mounting structure comprising a low pass filter holder formed of an elastic material and having first and second frame portions with respective inner peripheries, the inner peripheries of said first and second frame portions being slightly smaller than the outer peripheries of a low pass filter and a solid state image pickup element, respectively, in a state prior to assembly where no force is applied thereto, in which said low pass filter is press fitted into and fixed to said first frame portion of said low pass filter holder; said solid state image pickup element is mounted to said second frame portion of said low pass filter holder in a press fitting manner to thereby fix said low pass filter and solid state image pickup element integrally with each other, with said low pass filter being on board a front surface of said solid state image pickup element; and, said low pass filter holder is fastened and fixed through said solid state image pickup element to a reference plate by fastening means.

2. A solid state image pickup device mounting structure as set forth in claim 1, wherein said low pass filter holder includes flanges formed integrally therewith to prevent entry of light and dust, said flanges extending from a surface of said low pass filter holder that is adapted to be opposed to a lens barrel and being pressable against the lens barrel.

3. A solid state image pickup device mounting structure, in which a low pass filter is press fitted into a low pass filter frame formed of an elastic material, an inner periphery of said low pass filter frame is slightly smaller than an outer periphery of said low pass filter in a state prior to assembly where no force is applied thereto, said low pass filter frame and a solid state image pickup element are held and fixed by a low pass filter holder member engageable with said low pass filter frame and solid state image pickup element, with said low pass filter being on board a front surface of said solid state image pickup element, and said low pass filter holder member is fastened and fixed through said solid state image pickup element to a reference plate by fastening means.

4. A solid state image pickup device mounting structure as set forth in claim 3, wherein in said low pass filter holder member there is formed integrally therewith a leg portion extending out through said reference plate for contacting a base plate, said base plate receiving an end of said solid state image pickup element.

* * * * *